US006590377B2

(12) United States Patent
Prockup (10) Patent No.: US 6,590,377 B2
(45) Date of Patent: Jul. 8, 2003

(54) NARROW BAND FREQUENCY DETECTION CIRCUIT (75) Inventor: Kenneth M. Prockup, Emmaus, PA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/950,238

(22) Filed: Sep. 7, 2001

(65) Prior Publication Data

US 2003/0057936 A1 Mar. 27, 2003

(51) Int. Cl.[7] .......................... G01R 23/12; G01R 25/00
(52) U.S. Cl. .................................. 324/76.53; 324/76.78
(58) Field of Search ........................... 324/76.53, 76.83, 324/76.78, 76.57

(56) References Cited

U.S. PATENT DOCUMENTS

| 4,525,685 | A | * | 6/1985 | Hesselberth et al. | 331/10 |
| 4,715,001 | A | * | 12/1987 | Deem et al. | 331/18 |
| 5,038,096 | A | * | 8/1991 | Obie et al. | 324/76.23 |
| 5,262,957 | A | * | 11/1993 | Hearn | 324/76.19 |
| 5,305,008 | A | * | 4/1994 | Turner et al. | 342/44 |
| 5,769,503 | A | * | 6/1998 | Stolarczyk et al. | 299/1.2 |
| 6,016,080 | A | * | 1/2000 | Zuta et al. | 324/76.82 |
| 6,157,183 | A | * | 12/2000 | Bradley | 324/76.13 |
| 6,157,198 | A | * | 12/2000 | Mauerman | 324/601 |
| 6,175,280 | B1 | * | 1/2001 | Lloyd et al. | 331/1 R |

* cited by examiner

Primary Examiner—N. Le
Assistant Examiner—John Teresinski
(74) Attorney, Agent, or Firm—Ron Billi (57) ABSTRACT A frequency detection circuit is disclosed that employs a phase lock loop circuit in operative cooperation with a microprocessor. The microprocessor provides a control signal to an oscillator of the phase lock loop circuit so as to control its free-running frequency. The microprocessor has prestored quantities that represents predetermined parameters for measuring the frequency components contained in a tone burst transmitted from a sonobuoy. The microprocessor provides an output signal if the measured parameters correspond to predetermined and desired parameters. The microprocessor has predetermined parameters for measuring the length of the tone burst. The microprocessor provides a serial output signal transmitting the frequency and tone burst length measurements.

11 Claims, 5 Drawing Sheets

NARROW BAND FREQUENCY DETECTION CIRCUIT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1.0 Field of the Invention

The present invention relates to frequency detection and, more particularly, to a circuit for narrow band frequency detection particularly suited for measuring, even in the presence of interfering frequencies and noise, the frequencies components contained in a tone burst.

2.0 Description of the Related Art

Presently information contained in toned burst transmitted to devices, such as sonobuoys, are detected by tone decoders comprised of integrated circuits which, in their classical form are made up of analog components. The tone burst is commonly used as a transmitted signal consisting of a two tone sinewave sustained for a short duration from about 50 to 500 milliseconds, representing the sonobuoy address, followed by a single tone for a duration from about 50 to 1000 millisecond representing the sonobuoy command. Whereas the tone decoders provide an indication of the existence of the tone burst, even in the presence of interfering frequencies and noise, the analog components of the integrated circuit can drift and age. The utilization of the tone decoder having analog components typically requires the manual setting of a free-running frequency of the tone decoder and, therefore, is individually calibrated. The utilization of the tone decoder detecting the information, such as the address and command determination of the associated sonobuoy, commonly requires a separate tone detector circuit for each command identification contained in the tone burst to be decoded. It is desired that a tone decoder be provided that does not suffer the drawbacks created by drifting and aging analog components, does not require the need for individual calibration, and does not require a separate tone detector to identify the individual frequencies components, (e.g., address and command) contained in the tone burst. Further, it is desired that the tone decoder provide additional capabilities. For example, by having the tone detector measure component frequency in the one burst, the capture range, known in the art, is effectively narrowed as compared to a conventional tone decoder.

Another approach used in the detection of information, such as sonobuoy address information contained in the tone burst, is the utilization of a Digital Signal Processor (DSP). The DSP approach is currently used for a particular type of sonobuoy known as the NUAMP. Although the DSP serves well its intended purpose, it possesses drawbacks with regard to the address and command detection because of its cost, and the need of additional electrical and RF power requirements thereby reducing the effectiveness to accurately detect valid sonobuoy addresses. Commonly for the DSP to accurately detect a valid sonar code, the RF power contained in the tone burst from a NUAMP sonobuoy must be greater than −45 dBm, whereas the standard tone detector, sometimes identified as DICASS, responds and accurately processing of tone burst having a power level down to −85 dBm. Because the tone burst usually lasts less then 250 millisecond, the amount of time data is digitized in the DSP approach is limited, and therefore, the frequency bin width is also limited. It is desired to provide for a tone decoder, particularly suited for sonobuoy applications that does not suffer the drawbacks of the Digital Signal Processor (DSP).

OBJECTS OF THE INVENTION

It is a primary object of the present invention to provide for a tone decoder that detects for the information, comprised of frequency components, contained in a tone burst even in the presence of interfering frequency and noise, while at the same time does not suffer any system degradation typically created by analog components, as well as detects the information contained in tone burst signals having power levels as low as −85 dBm.

It is a further object of the present invention to provide for a phase lock loop circuit having an oscillator responsive to a control signal generated by a microprocessor containing stored quantities that may represent either a predetermined address contained in the tone burst, the length of the duration of address information, and whether a particular time delay occurs before the command information becomes present in the tone burst signals.

SUMMARY OF THE INVENTION

This invention is directed to a frequency detection circuit for measuring information comprised of frequency components contained in tone burst signals even in the presence of interfering frequencies and noise and is particularly suited for sonobuoy applications.

The frequency detection circuit comprises a phase lock loop circuit and a microprocessor. The phase lock loop circuit has an oscillator having a free-running frequency with the phase lock loop circuit also having input, control, and output stages. The input stage receives the tone burst. The control stage is responsive to a control signal to determine the free-running frequency. The output stage provides an output signal having a frequency corresponding to the frequency of the tone burst. The microprocessor has at least one stored quantity representative of a predetermined frequency. The microprocessor has an output stage and an input stage with the input stage thereof connected to the output stage at the phase lock loop circuit. The output stage of the microprocessor is connected to the control stage of the phase lock circuit and provides a control signal thereto. The microprocessor has means for measuring the frequency of the output signal of the phase lock loop circuit and generates an output signal when the stored predetermined frequency equals the frequency of the output signal of the phase lock circuit. The microprocessor also has means for measuring the length of the tone burst. The measured frequency and length of the tone burst can be advantageously outputted by the microprocessor in serial form.

BRIEF DESCRIPTION OF THE DRAWINGS

A better understanding of the present invention may be realized when considered in view of the following detailed description, taken in conjunction with the accompanying drawings wherein.

DETAILED DESCRIPTION OF THE PREFERRED EMBODIMENTS

Figure 1:
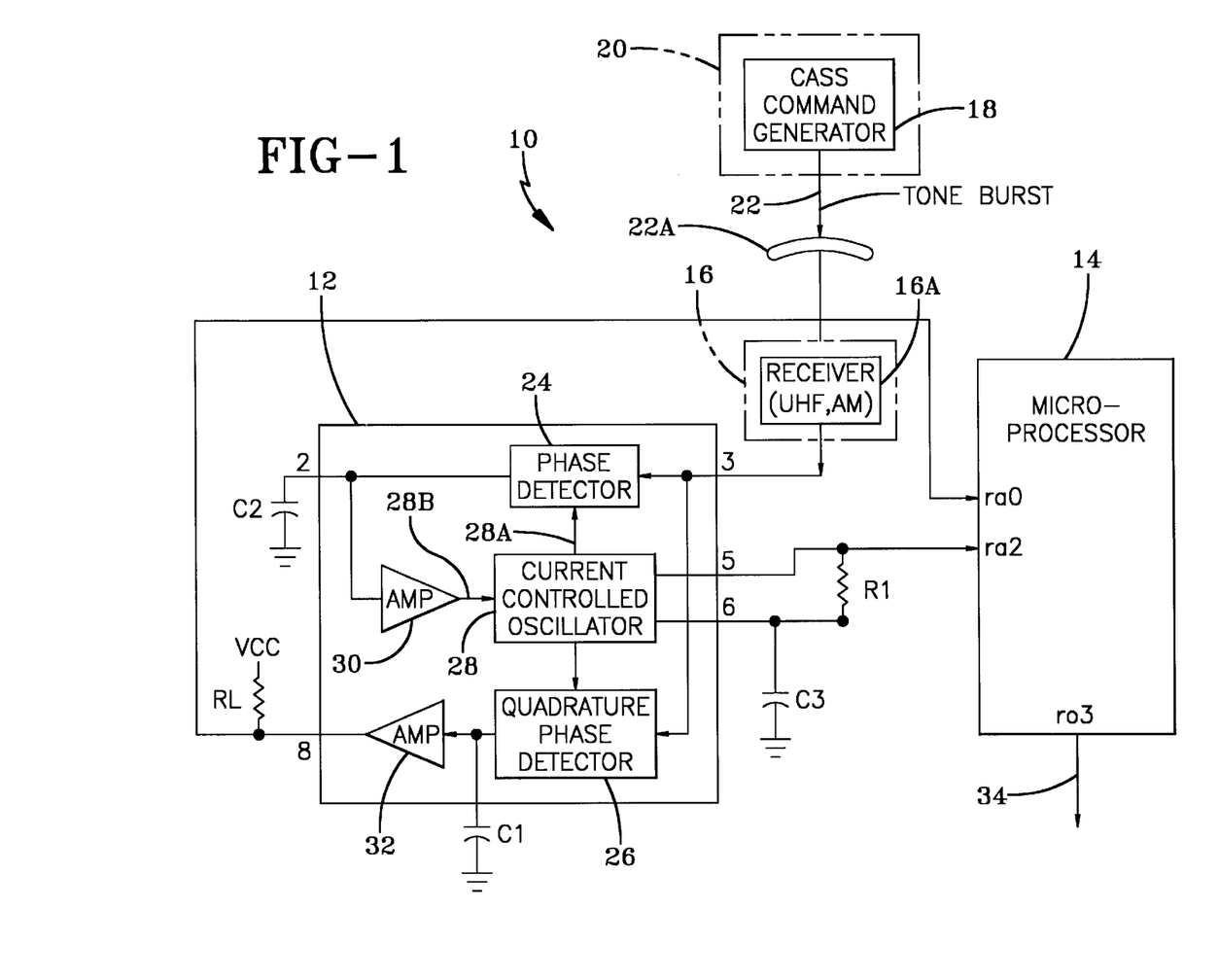
FIG. 1 is a block diagram of one embodiment of the present invention.

Referring to the drawings wherein the same reference umber indicates the same element throughout, there is shown in FIG. 1 a block diagram of one embodiment of a frequency detection circuit 10 of the present invention serving as a tone detector. The frequency detection circuit 10 of FIG. 1 comprises a phase lock loop circuit 12 and a microprocessor 14, which may be any single chip of the type, such as Zilog Z8, Motorola 6805, or an Intel 87751. The phase lock loop circuit 12, alone without the benefits of the present invention, served as a prior art tone detection, but had the drawbacks described herein in the "Background" section. The frequency detector circuit 10 of the present invention, in operative cooperation with the microprocessor 14, is particularly suited to serve the needs of a sonobuoy 16 that includes a receiver 16A.

Command Active Sonobuoy System(CASS) command generator 18, typically located inside a P-3 aircraft 20 contains circuitry that generates frequency components comprising address and command information that is contained in a tone burst signal which is transmitted, in the UHF band with AM modulation, from the CASS command generator 18 by way of signal path 22 and received by an antenna arrangement 22A that provides a corresponding output signal that is routed to the receiver 16A of the sonobuoy 16 which is subsequently routed to the phase lock loop circuit 12.

The phase lock loop circuit 12 comprises a phase detector 24, a quadrature phase detector 26, a current controlled oscillator 28, a first amplifier 30, and a second amplifier 32. The phase detector 24 has an input for receiving the tone burst signal supplied from sonobuoy receiver 16A, a first control input responsive to a first output 28A of the oscillator 28 and an output connected, preferably by way of first amplifier 30, to a first control input 28B of the oscillator 28. The output of the phase detector 24 is also preferably connected to pin 2 of the phase lock loop circuit which, in turn, is connected to ground by way of a loop filter capacitor C2 having a typical value of 0.47 μf.

The quadrature phase detector 26 has an input stage which receives the tone burst signal from sonobuoy receiver 16A, and a control input receiving and being responsive to a signal on the second output 28C of the oscillator 28. The quadrature phase detector 26 provides an output connected to the output of the phase lock loop circuit 12, that is, pin 8 thereof, preferably by way of the second amplifier 32. The output of the phase lock loop circuit 12, that is, pin 8 thereof, is connected to the input of the microprocessor 14, that is, pin ra0 thereof. Further, pin 8 is also connected to one end of a pull-up resistor RL, having a typical value of 10 Kohms, that has its other end connected to excitation Vcc. Further, the output of the quadrature phase 26 is preferably connected to ground by way of capacitor C1 having a typical value of 1 μf.

The oscillator 28 serves as a control stage of phase lock loop circuit 12 and has its free-running frequency controlled by the resistance-capacitance values across pins 5 and 6 thereof. More particularly, the oscillator 28 uses the resistance between 5 and 6 plus a capacitor between pin 6 and ground to control its free-running frequency. Further, pin 5 of the oscillator 28 is connected to pin ra2 of the microprocessor 14.

The microprocessor 14 has stored predetermined quantities representative of desired parameters for determining the status of the operation of the sonobuoy 16. For example, the microprocessor 14 may store predetermined quantities that correspond to the desired frequency of the tone burst signal of the sonobuoy 16 and the desired address and command parameters of the sonobuoy 16 comprising some of the frequency components contained in the tone burst signal.

As previously mentioned, pin 5 of oscillator 28, which for the embodiments of FIGS. 1–4 is a current control oscillator (CCO) is connected to the ra2 pin of the microprocessor 14. Pin 5 acts like a pseudo-output of the CCO 28 and is connected to the microprocessor 14 to measure the frequency on this pin. The main purpose of pin 5 is to provide a voltage to the resistor R1 which, in turn, provides current to charge and discharge the capacitor C3. Pin 6 of the CCO 28 is the sense pin cooperating with preset thresholds which allow the CCO 28 to oscillate. A typical value of R1 is 22 Kohms, and a typical value of C3 is 4.7 nF.

The microprocessor 14 has an input that is connected to the output of the phase lock loop circuit 12, that is, pin 8 thereof. The microprocessor 14 has means for measuring the frequency of the output signal of the CCO 28 and generates an output signal when the predetermined frequency quantity equal the frequency of the output signal of the CCO 28. The output of the microprocessor 14 is made available at pin ra3 which, in turn, is connected to signal path 34.

The operation of frequency detection circuit 10 of FIG. 1 may be described with reference to pins 5 and 6 of he phase lock loop circuit 12 and with reference to pin 8 thereof connected to the input of the microprocessor 14. Initially, the free-running frequency is established by the selection of the values of R1 and C3 serving as means to control the free-running frequency. The control means may be also provided by other embodiments of the invention, such as, a selectable resistor/analog switch to be further described hereinafter with reference to FIG. 2. The frequency of the signal applied on pin 5 is measured and determined by the microprocessor 14. The measurement of this frequency is initiated when pin 8 (via ra0) is at a low level. When phase lock loop 12 is in locked condition pin 8 is set to a low level, otherwise pin 8 is at a high level. The microprocessor 14 includes firmware that senses the phase lock detection of the level at pin 8 and begins measuring the frequency of pin 5 by counting the number of states ra2 changes divided by a software register counted as a software timer while pin 8 is at a low level.

In one embodiment, a program loop in microprocessor 14 is executed while pin 8 is low. When pin 8 becomes high, the microprocessor 14 calculates the following formulas to measure the frequency and length of the tone burst, wherein is expressed as:

$$freq = \frac{cco\_count \times F_{clock}}{loop\_count \times 2 \times 68}$$

where cco_count is the count of the states ra2 changes and the constant 2 represents the fact that we are counting both transitions, one to zero and zero to one and thus get two counts per cycles. Loop_count is the number of times the program loop is executed. Fclock is the frequency of the crystal in microprocessor 14 and the constant 68 is the number of clock cycles in the program loop. The length of the tone burst may be expressed as:

$$length = \frac{loop\_count \times 68}{F_{clock}}$$

The software counters/timers (i.e. loop_count and cco_count) may be replaced by two hardware counters. One counter counts the number of CCO oscillator cycles while pin 8 lock detect is low. The second counter counts the number of microprocessor clock cycles while pin 8 lock detect is low. The term "lock detect" is meant to represent the state when the phase lock loop circuit 12 is in synchronization with its input signal, that is, the tone burst signal. When pin 8 becomes high, the frequency and length are calculated by the following formulas: freq= counter$_1 \cdot F_{clock}$÷counter$_2$; length=counter$_2$÷$F_{clock}$. This approach of using two counters is used if the frequency of interest is higher than the throughput of the microprocessor 14. For all such embodiments, if the measured frequency is within a predetermined window, the microprocessor 14, in particularly, its pin ra3 is set to a logic "1," otherwise this pin ra3 is set to a logic "0."

It should now be appreciated that the practice of the present invention provides for one embodiment for detecting the frequency component representing the address parameter of the sonobuoy 16 included in the tone burst signal and measures such an address to be within a predetermined frequency bin.

In addition to the detection of the frequency of the address, the microprocessor 14 can also measure the length of time pin 8 is at a low level to determine if the address ping signal falls within a predetermined time. This eliminates the need of an analog timer or a digital counter commonly found in tone detectors used for sonobuoy applications.

The microprocessor 14 having the appropriate software can also be used to delay the activation of pin ra3 so as to wait for a prescribed time before command tone initiates. This software will eliminate the typically mechanism that is used in conventional tone detectors for analyzing sonar address timing support. The microprocessor 14 having the appropriate software can output the frequency of the tone burst and the length of time pin 8 is at a low level using pin ra3 in a serial format.

The frequency detection circuit 10 of FIG. 1 can also be used for the decoding of the sonobuoy's command. This reduces the sonobuoy's cost by not requiring one tone decoder IC (and associate timers) for each command to be decoded. By using the frequency detector circuit 10, instead of a comparator commonly employed for this purpose, to measure the command frequency allows this frequency to be accurately measured even though it may be buried within noise or low RF level interference signals. This is accomplished by the fact that the phase lock loop circuit 12 oscillator 28 (current control oscillator 28) tracks (equals) the incoming frequency when the phase lock loop circuit 12 is in a locked condition. The frequency detection circuit 10 of FIG. 1 allows the expansion to accomodate future command tones where its detection ability is based on the microprocessor's 14 crystal and not the capture range or analog components within the phase lock loop circuit 12 and allows these commands to be closely spaced in frequency.

By incorporating the frequency detector circuit 10 of FIG. 1 within an active sonobuoy, such as sonobuoy 16, the number of sonobuoy channels can be increased. The sonobuoys commonly include tone detectors that employ the form $$\frac{n^2 - n}{2}$$

for their internal addresses, where n is the number of unique frequencies within the address matrix assigned to the associated sonobuoy. By using the frequency detection circuit 10 of FIG. 1, the address channels are expanded to:

$$\frac{(n \cdot m)^2 - (n \cdot m)}{2} - n \cdot m,$$

where n is the number of conventional frequencies assigned to a sonobuoy and m is the subdivision of frequencies within the same capture range of a conventional sonobuoy tone decoder. If the value of n is increased using the conventional technique, the capture range within the tone decoder would become $$\frac{f_n - f_1}{n}.$$

This reduced capture range would be difficult to achieve using the conventional tone detector configuration. All of the broadening features related to address changes are accomplished by the incorporation of the associated firmware into the microprocessor 14.

Figure 2:
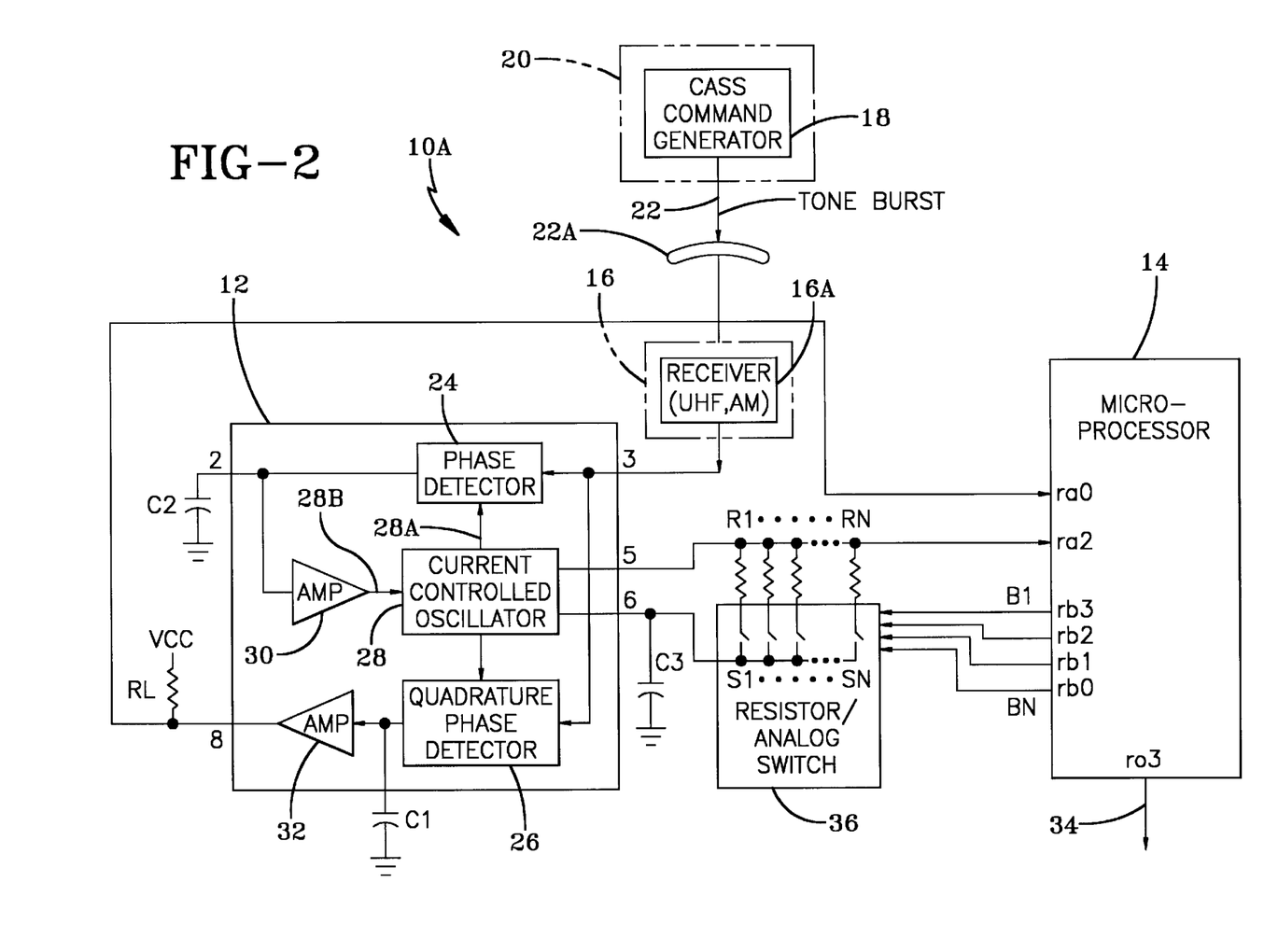
FIG. 2 is a block diagram of a second embodiment of the tone detector of the present invention.

Another embodiment 10A of the present invention is shown in FIG. 2 which is the same arrangement as FIG. 1 with the exception that a resistor/analog switch 36 and the capacitor C3, previously discussed with reference to FIG. 1, are imposed between phase lock loop circuit 12 and the microprocessor 14 and arranged across the control input pins 5 and 6, of the phase lock loop circuit 12 as shown in FIG. 2.

The resistor/analog switch 36 comprises a plurality if resistor R1 . . . RN, a corresponding plurality of switches S1 . . . SN, and further a corresponding plurality of control inputs B1 . . . BN respectively connected to pins rb3, rb2, rb1, and rb0.

In operation, the microprocessor 14 of FIG. 2 selectively activates one of its pins, such as rb0, which, in turn, activates the switch S1 which, in turn, places the resistance R1 in serial connection with capacitor C3 which, in turn, places the resistor capacitor value (R1)(C3) across the input stage connected to pins 5 and 6.

The resistance between 5 and 6 can be varied by using the resistor/analog switch 36. This variation allows for the ability to change the frequency band which the oscillator 28 operates within, more particularly, its free-running frequency initially established by the microprocessor 14. The arrangement of FIG. 2 becomes useful in use of "Electronic Function Select" (EFS) or "Remote Function Select" (RFS) each of which has a desired free-running frequency.

The purpose of varying the resistance between pins 5 and 6 of the phase lock loop circuit 12 is to allow the microprocessor 14 to adjust the free-running frequency so as to select which banks of the address frequency to detect, such as EFS or RFS, or to allow for correction of the drift of the free-running frequency caused by temperature and aging of analog components. This variation in free-running frequency may also be provided by an alternate embodiment 10B shown in FIG. 3.

Figure 3:
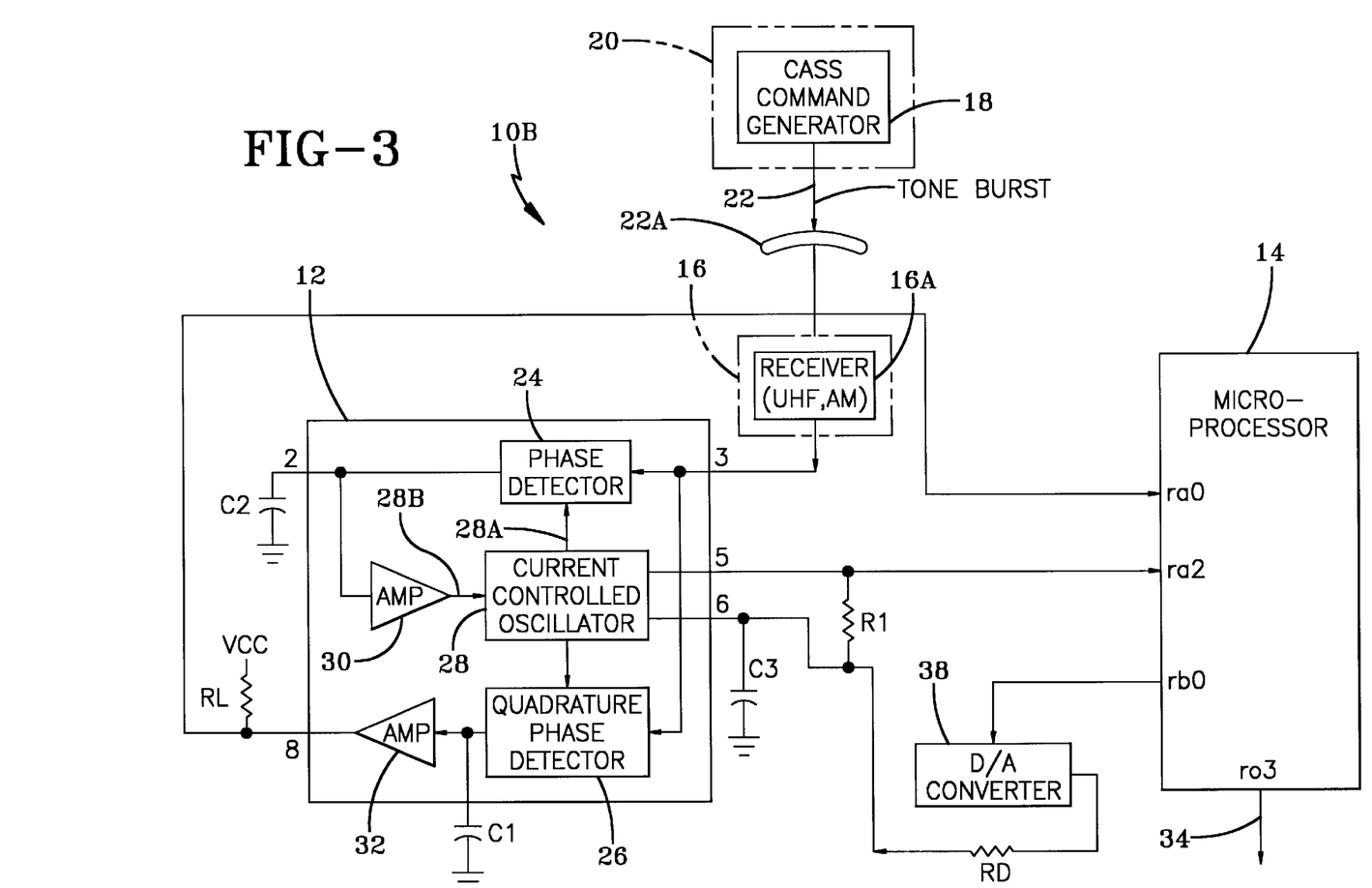
FIG. 3 is a block diagram of a third embodiment of he tone detector of the present invention.

FIG. 3 illustrates an arrangement for varying the free-running frequency by adding a D/A converter 38 in series with a resistor RD, having a typical value of 12 K, connected to pin 6 and by using a fixed resistor R1 between pins 5 and 6 as shown in FIG. 3. In operation, the D/A converter 38 provides a current path to charge C3 faster and thus raise the free-running frequency of CCO 28. It has been determined that the arrangement of FIG. 3 using a D/A converter 38, has a limitation in that it only allows for a variation of one octave and produces a variable duty cycle well below 50% and thus allows chatter within the output pin 8 of the phase lock loop circuit 12. However, the D/A converter 38 is series with resistor RD serves the intended purpose of compensating for temperature and aging due to small frequency variations, such as less than 10% of the free-running frequency. This variation in the free-running frequency can skew the detection of tone burst in the adjacent frequency bin used during the measurement of the tone burst and result in the detection of the wrong address or command of the sonobuoy 16. The resistor/analog switch 36 may also be replaced by a further embodiment 10C shown in FIG. 4.

Figure 4:
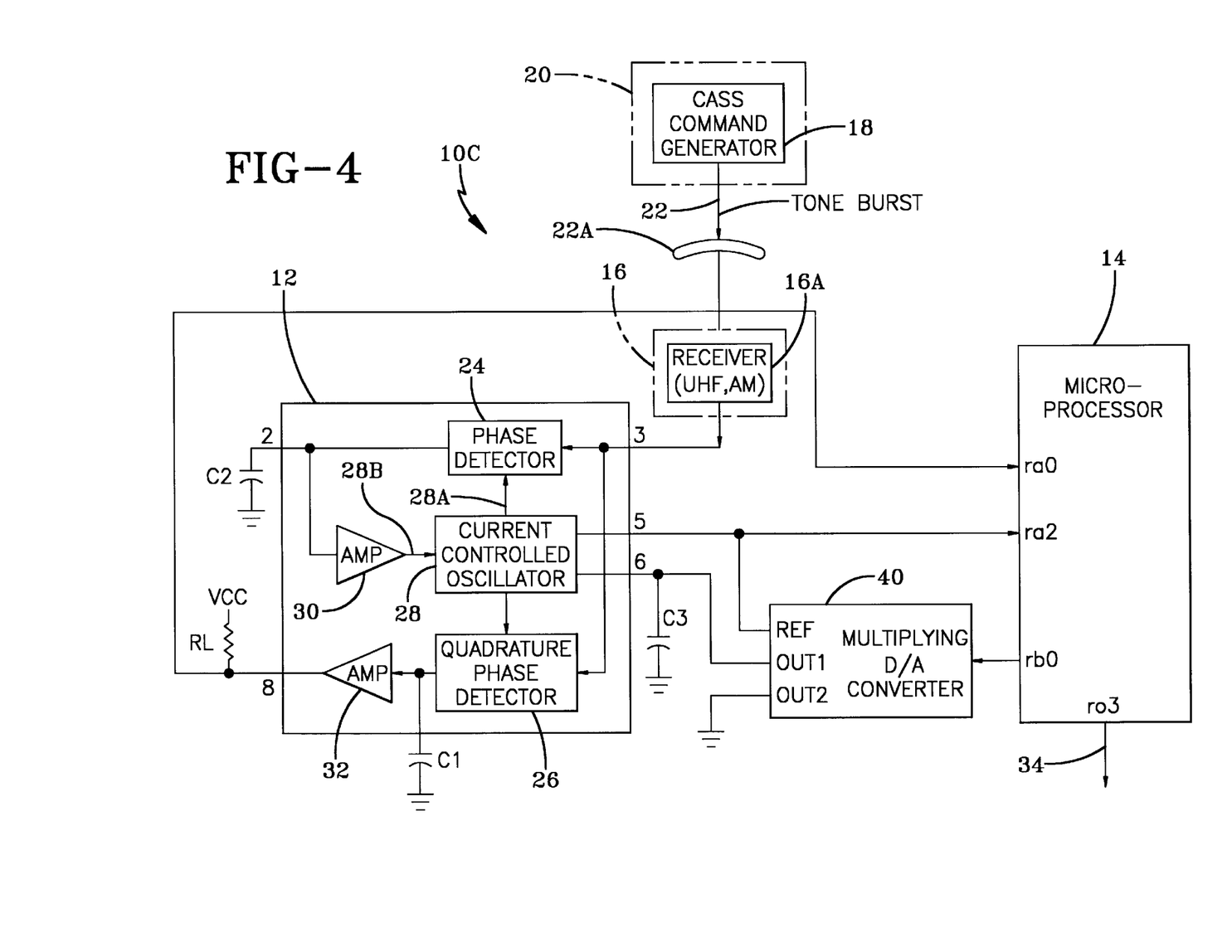
FIG. 4 is a block diagram of a fourth embodiment of he tone detector of the present invention.

FIG. 4 shows a multiplying D/A converter 40. The multiplying D/A converter 40 is configured in such a way as the resistance between Ref and Out1 varies proportional to the digital number inputted to the D/A converter 40 from the microprocessor 14. The Ref pin of the multiplying D/A converter 40 is connected to pin 5 of the phase lock loop 12, and Out1 is connected to pin 6 of the phase lock loop circuit 12. More particularly, the D/A converter 40 has its resistance change, between Ref and Out, proportion to digital input, as opposed to a conventional D/A which has an output voltage proportional to the digital input.

Figure 5:
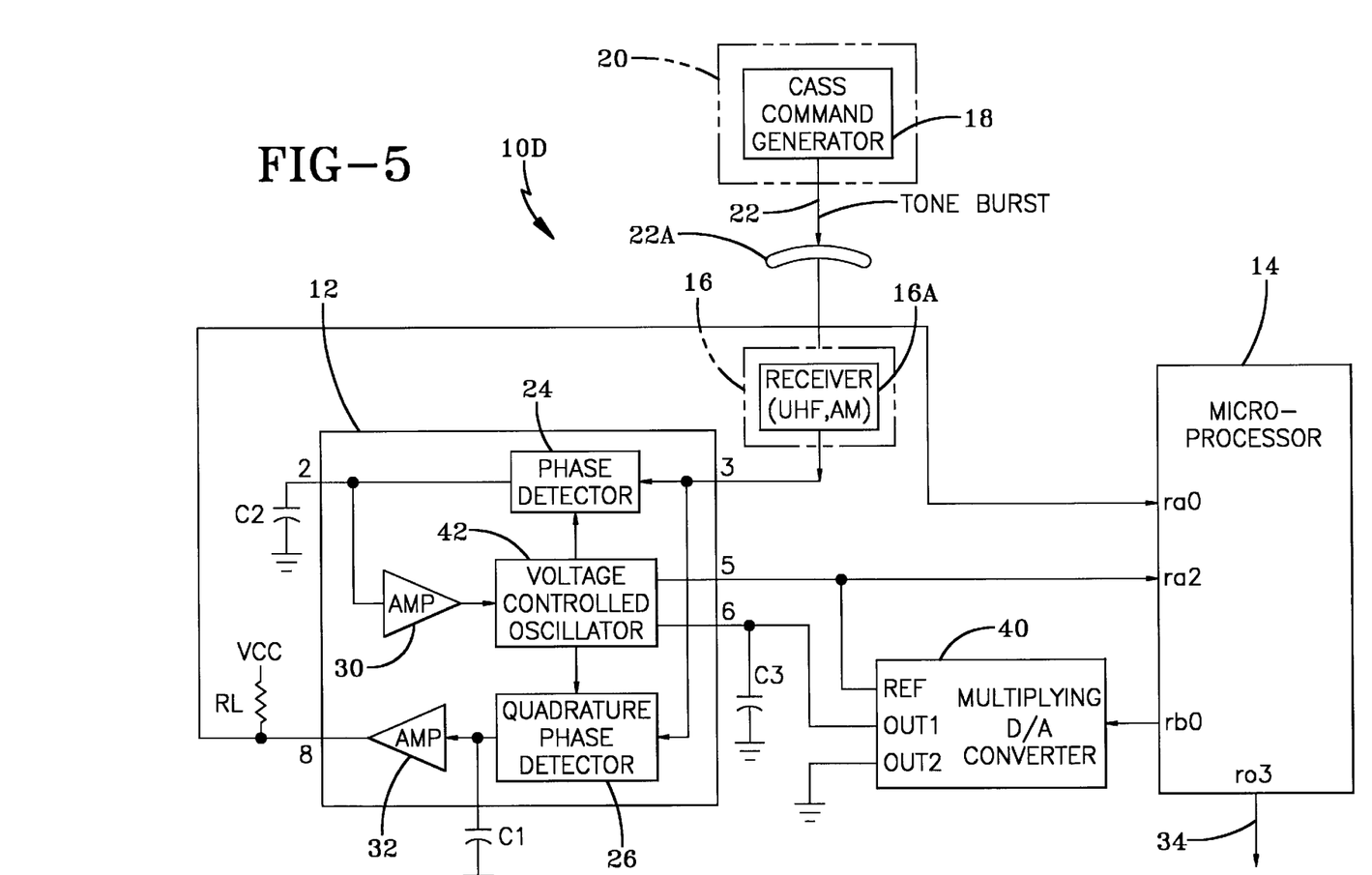
FIG. 5 is a block diagram of a tone detector of a fifth embodiment of the present invention.

A still further embodiment 10D of the present invention may be further described with reference to FIG. 5. FIG. 5 illustrates the utilization of a voltage control oscillator (VCO) 42, which may be swept by an output provided by the microprocessor 14 to the control stage defined by pins 5 and 6 of the phase lock control circuit 12, until the phase lock control circuit 12 locks onto the appropriate tone within a dual tone burst commonly employed by sonobuoys. This can generator. The D/A converter 40 provides for a fine tune adjustment of the frequency of the VCO 42.

It now should be appreciated that the practice of the present invention provides for accurate determination of address and commands information represented by frequency components contained in tone burst and is particularly suited for usage for sonobuoy applications. The capture range, that is the frequencies in which a circuit operates, are extended over those of previously known tone detector circuits and allows for variation in component aging and temperature variations. The present invention allows for protection against a tone burst signal of one channel skewing into an adjacent channel, with a microprocessor 14 measuring the true frequency and recognizing, but ignoring the skewing the condition and also advantageously sending the "address select" signal to only the valid address. The present invention also allows more frequencies to be assigned within the same capture band arrangement. Furthermore, additional channels within the addressed matrix of a sonobuoy may be provided while at the same time enhanced commands can now be handled by the present invention without suffering the cost consequences related to the DSP approach or without suffering the problems created by aging conditions of analog components.

Obviously, many modifications and variations of the present invention are possible in light of the foregoing teaching. It is, therefore, to be understood that within the scope of the appended claims, the invention may be practiced otherwise than as specifically described.

What I claim is:

1. A frequency detection circuit for measuring in the presence of noise and interfering frequencies the frequency components contained in a tone burst comprising:
   a) a phase lock loop circuit with an oscillator having a free-running frequency and having input, control, and output stages, said input stage receiving said tone burst, said control stage being responsive to control means to control said free-running frequency, and said output stage providing an output signal having a frequency corresponding to said frequency of said tone burst; and
   b) a microprocesor having at least one stored predetermined quantity representative of a predetermined frequency serving as a selectable standard for measuring said frequency components contained in said tone burst and having an output stage and an input stage, said input stage connected to said output stage of said phase lock loop circuit, said output stage connected to said control stage of said phase lock loop circuit, said microprocessor having means for measuring said frequency of said output signal of said phase control loop circuit and generating an output signal when said stored predetermined frequency equals said frequency of said output signal of phase loop circuit.

2. The circuit according to claim 1, further comprising a resistor/analog switch and a capacitor imposed between said phase lock loop circuit and said microprocessor and arranged across said control stage of said phase lock loop circuit.

3. The circuit according to claim 2, wherein said resistor/analog switch has a plurality of selectable switches and wherein said microprocessor further has a plurality of selectable outputs respectively connected to said selectable switches.

4. The circuit according to claim 1, frequency detection further comprises a D/A converter having one end serially connected to said output of said microprocessor and the other end connected to said control stage of said phase lock loop circuit.

5. The circuit according to claim 4, further comprising a resistor imposed between said the other end of said D/A converter and said control stage of said phase lock loop circuit.

6. The circuit according to claim 1, wherein said microprocessor has a plurality of outputs and wherein said frequency detector circuit further comprises a multiplying D/A converter arranged and connected to said control stage of said phase lock loop circuit and providing an output representative of a resistance determined by said microprocessor.

7. The circuit according to claim 1, wherein said oscillator is a current control oscillator having first and second outputs and wherein said phase lock loop circuit comprises:
   a) a phase detector having an input receiving said tone burst, a first control input responsive to said first output of said oscillator and an output connected to a first control input of said oscillator;
   b) a quadrature phase detector having an input receiving said tone burst, a control input responsive to said second output of said oscillator and an output providing said output signal of said phase lock loop circuit; and
   c) said oscillator serving as said control stage of said phase lock loop circuit and receiving said control signal that determines said free-running frequency.

8. The circuit according to claim 7, further comprising first and second amplifiers, said first amplifier imposed between said output of said phase detector and said first control input of said oscillator, and said second amplifier imposed between said output of said quadrature phase detector and said output of said phase lock loop circuit.

9. The circuit according to claim 1, wherein said oscillator is a voltage controlled oscillator having first and second outputs and wherein said phase lock loop circuit comprises:
   a) a phase detector having an input receiving said tone burst, a control input responsive to said first output of said oscillator and an output connected to a second control input of said oscillator;
   b) a quadrature phase detector having an input receiving said tone burst, a control input responsive to said second output of said oscillator and an output providing said output signal of said phase lock loop circuit; and
   c) said oscillator serving as said control stage of said phase lock loop circuit and receiving said control signal that determines said free-running frequency.

10. The circuit according to claim 9, further comprising first and second amplifiers, said first amplifier imposed between said output of said phase detector and said first control input of said oscillator, and said second amplifier interposed between said output of said quadrature phase detector and said output of said phase lock loop circuit.

11. The circuit according to claim 1 wherein the output of the microprocessor is provided in a serial format.

* * * * *